United States Patent
Townsend

(10) Patent No.: US 9,788,446 B1
(45) Date of Patent: Oct. 10, 2017

(54) MOBILE VIBRATION ISOLATION DEVICE

(71) Applicant: Paul H. Townsend, Tucson, AZ (US)

(72) Inventor: Paul H. Townsend, Tucson, AZ (US)

( * ) Notice: Subject to any disclaimer, the term of this patent is extended or adjusted under 35 U.S.C. 154(b) by 0 days.

(21) Appl. No.: 15/066,835

(22) Filed: Mar. 10, 2016

Related U.S. Application Data

(60) Provisional application No. 62/139,499, filed on Mar. 27, 2015, provisional application No. 62/299,678, filed on Feb. 25, 2016.

(51) Int. Cl.
*F16F 7/00* (2006.01)
*H05K 7/06* (2006.01)

(52) U.S. Cl.
CPC .... *H05K 7/06* (2013.01); *F16F 7/00* (2013.01)

(58) Field of Classification Search
CPC ........ H05K 7/06; A47C 3/0255; B60N 2/502; B60N 2/505; B60N 2/507; B60N 2/508; F16F 7/02; F16F 7/023; F16F 7/04; F16F 7/06; F16F 7/065; F16F 7/00
USPC ............... 248/636, 618, 634, 560, 570, 568, 248/346.01, 346.03, 346.04, 346.05, 248/346.11; 188/378, 379, 380; 267/147, 148
See application file for complete search history.

(56) References Cited

U.S. PATENT DOCUMENTS

| | | | | |
|---|---|---|---|---|
| 3,204,912 A * | 9/1965 | Lawrence | ................. | F16F 7/14 248/638 |
| 3,204,943 A * | 9/1965 | Kerley, Jr. | ................. | F16D 3/60 248/570 |
| 3,596,865 A * | 8/1971 | Camossi | ............... | F16L 55/035 248/318 |
| 4,190,227 A * | 2/1980 | Belfield | .................... | F16F 7/14 248/618 |
| 4,783,038 A * | 11/1988 | Gilbert | ...................... | F16F 7/14 248/570 |
| 5,169,110 A * | 12/1992 | Snaith | ...................... | F16F 7/14 248/570 |
| 5,222,701 A * | 6/1993 | Rowland | .............. | B65H 75/366 248/222.13 |
| 5,499,790 A * | 3/1996 | Hay | ......................... | F16F 7/14 188/378 |
| 5,522,585 A * | 6/1996 | Loziuk | ...................... | F16F 7/14 188/378 |
| 5,897,093 A * | 4/1999 | Le Derf | .................... | F16F 7/14 248/570 |

(Continued)

*Primary Examiner* — Nkeisha Smith
(74) *Attorney, Agent, or Firm* — Hayes Soloway P.C.

(57) ABSTRACT

Mobile vibration isolation devices and methods for reducing vibration transfer to electrical or electronic devices are provided. One such mobile vibration isolation device includes an array of two or more vibration isolation elements, and one or more flexible elements. The array of vibration isolation elements is connected by said one or more flexible elements. Preferably, the vibration isolation elements have at least a portion thereof of a cross linked polymer foam. More preferably, the vibration isolation elements have at least a portion thereof of SORBOTHANE®. A method for reducing vibration transfer to electrical or electronic devices includes the steps of providing a mobile vibration isolation device, and interposing the mobile vibration isolation device between the electrical or electronic device and a vibrating surface, thereby reducing vibration transfer to the electrical or electronic device.

16 Claims, 4 Drawing Sheets

(56) References Cited

U.S. PATENT DOCUMENTS

| | | | | |
|---|---|---|---|---|
| 6,290,217 B1* | 9/2001 | Schneider | ............... | F16F 7/14 |
| | | | | 188/378 |
| 6,375,147 B1* | 4/2002 | Radziun | ............ | G01R 33/3854 |
| | | | | 248/550 |
| 6,406,011 B1* | 6/2002 | Kosar | ..................... | F16F 7/14 |
| | | | | 248/570 |
| 7,303,185 B2* | 12/2007 | Sebert | ..................... | F16F 7/14 |
| | | | | 248/560 |
| 8,314,585 B2* | 11/2012 | Baker | ..................... | G05B 5/01 |
| | | | | 188/378 |
| 8,613,431 B1* | 12/2013 | Deloy | ..................... | F16F 7/14 |
| | | | | 248/570 |
| 8,695,917 B2* | 4/2014 | Cranga | ............... | B64C 27/001 |
| | | | | 188/379 |
| 9,285,111 B2* | 3/2016 | Todd, Jr. | ............ | F21V 33/0096 |
| 2007/0045070 A1* | 3/2007 | Damien | ............... | F16F 15/08 |
| | | | | 188/378 |
| 2015/0060634 A1* | 3/2015 | Munot | .................. | H02G 7/053 |
| | | | | 248/636 |
| 2016/0102725 A1* | 4/2016 | Slaven | ................. | A62B 35/04 |
| | | | | 248/636 |
| 2016/0108987 A1* | 4/2016 | Williamson | ............ | F16F 15/02 |
| | | | | 404/133.1 |

* cited by examiner

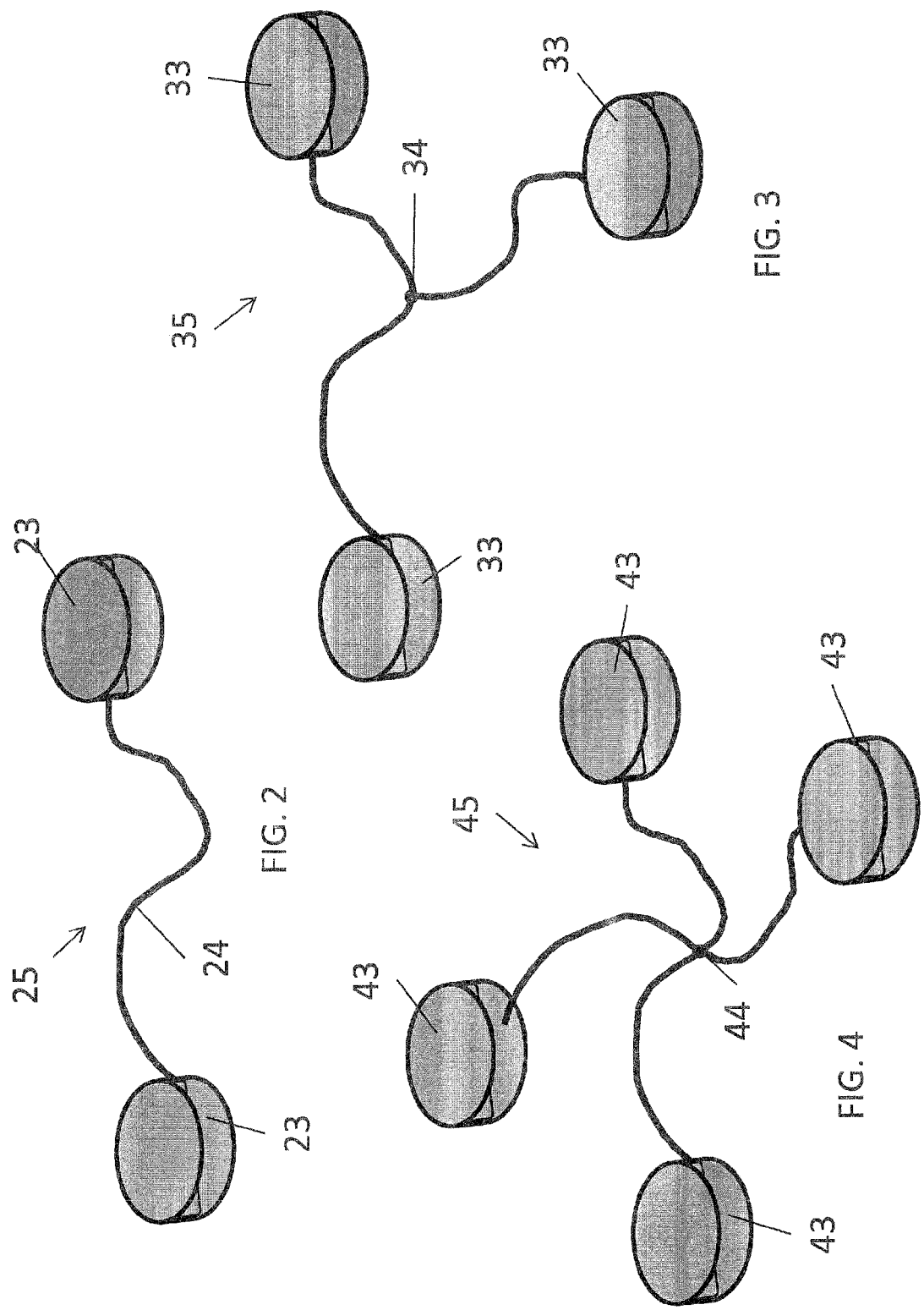

MOBILE VIBRATION ISOLATION DEVICE

CROSS REFERENCE TO RELATED APPLICATIONS

This application claims priority from U.S. Provisional Application Ser. No. 62/139,499 filed Mar. 27, 2015 and U.S. Provisional Application Ser. No. 62/299,678, filed Feb. 25, 2016, the contents of which are incorporated herein by reference.

BACKGROUND

Electrical and electronic devices are increasingly designed and produced in compact form factors to optimize mobile utility. Some examples of mobile devices, for which portable design aspects are essential, include: cell phones and computers; measurement instruments associated with electrical and optical transducers, such as signal measurement and analysis and position sensors; flat panel based devices, including televisions and video game devices; and sound reproduction equipment, including PA systems and musical instrument amplifiers.

The utility of the mobile design aspect is ultimately determined by the capabilities of the device itself and the associated fixtures used for securing the device in its environment and isolating the device from its environment.

Existing systems have not been entirely satisfactory in all respects. Custom holders are often manufactured; but, their form factor is often nearly as large as the device itself, if not somewhat larger; which compromises the mobility of the device as a system. Isolation pads are designed and manufactured as monolithic elements, with a size consistent with the size of the device. Thus, there remains a need for improved designs and methods for securing and isolating mobile devices.

SUMMARY

The system and component technologies described herein enable a system and method capable of securing a mobile device and isolating it from its environment.

One aspect of the present invention relies on the ability to connect a distributed array of two or more isolation elements by a flexible connector, which both permits the individual elements to be arrayed in an appropriate arrangement during use and packed into a more compact form for storage and transport. Such arrays of isolating devices are not presently known or available. According to certain embodiments of the present invention, the isolating elements may be the same or different, in terms of their isolation or mechanical support aspects.

The present disclosure addresses the issues with prior systems by deploying multiple isolation pads in an array configuration with a flexible connector. Such a deployment of multiple isolation pads with a flexible connector forms the basis for optimal isolation and mechanical support, while simultaneously optimizing the mobility of the whole system.

It is to be understood that both the foregoing general description and the following detailed description are exemplary and explanatory in nature and are intended to provide an understanding of the present disclosure without limiting the scope of the present disclosure. In that regard, additional aspects, features, and advantages of the present disclosure will be apparent to one skilled in the art from the following detailed description.

BRIEF DESCRIPTION OF THE DRAWINGS

The accompanying drawings, which are incorporated to and form part of the specification, illustrate embodiments of the present invention and, together with the description, serve to explain the principles of the invention.

FIG. 2 is a diagram of a mobile vibration isolation device having two similar vibration isolation elements connected by a flexible element, in accordance with embodiments provided by the present disclosure.

FIG. 3 is a diagram of three similar vibration isolation elements connected by a flexible element, in accordance with embodiments provided by the present disclosure.

FIG. 4 is a diagram of four similar vibration isolation elements connected by a flexible element, in accordance with embodiments provided by the present disclosure.

DETAILED DESCRIPTION

A system and method are described, which may be useful for providing mechanical support and vibration isolation for an electrical or electronic device, while maximizing the mobility of the support or isolation system between uses. In a preferred embodiment, the isolation support is a distributed array of isolating elements connected by a flexible element.

Figure 1:
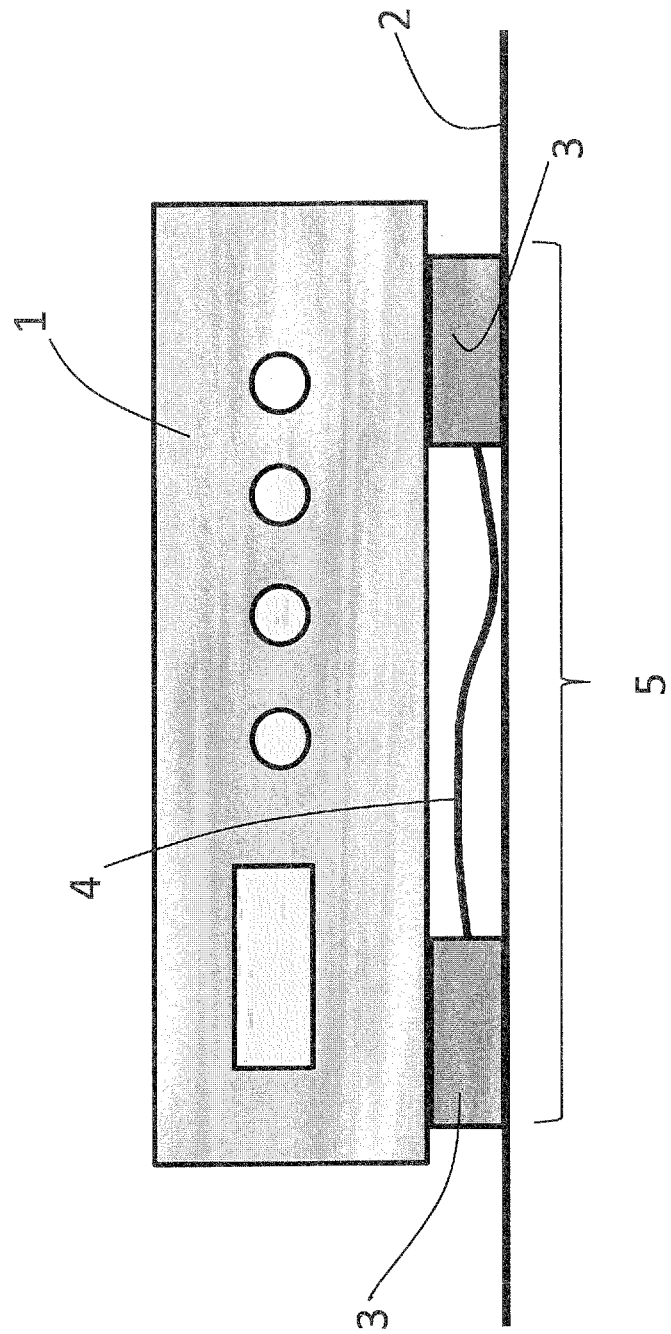
FIG. 1 is a diagram of an electrical or electronic device placed on a vibrating surface with a mobile vibration isolation device, having two or more vibration isolation elements and one or more flexible elements, placed between the electrical or electronic device and the vibrating surface, in accordance with a first exemplary embodiment provided by this disclosure.

Referring now to FIG. 1, an electrical or electronic device 1 may be placed on a vibrating surface 2. A mobile vibration isolation device 5 includes an array of two or more vibration isolating elements 3 which may be connected together by a flexible element 4. The mobile vibration isolation device 5 may be inserted between the electrical or electronic device 1 and the vibrating surface 2. The mobile vibration isolation device 5 thus isolates the electrical or electronic device 1 from the vibrating surface 2 during use, thereby reducing or eliminating the transfer of vibrational energy to the electrical or electronic device 1. The vibration isolation elements 3 may be shaped in any way that maximizes the stability of the electrical or electronic device 1, and may be composed of one or more materials which effectively reduces the transfer of the vibration from the vibrating surface 2 to the electrical or electronic device 1.

After use, the mobile vibration isolation device 5 may be stored in a compact mobile form. The flexible element 4 may be composed of any flexible material which allows for reducing the overall footprint of the device 5 (e.g., the footprint area of the device 5 when the array of vibration isolation elements 3 are fully spread apart), for example, by bringing the array of vibration isolation elements 3 close together into a bundle. The flexible element 4 may be or include any material having suitable tensile strength (i.e., such that the length of the flexible element 4 between any two vibration isolation elements 3, when pulled taut, provides some resistance to further pulling and effectively defines the maximum spacing between those vibration isolation elements 3) and low or no compressive strength such that the vibration isolation elements 3 may be brought close together without resistance (i.e., the flexible element 4 easily flexes to allow bundling of the vibration isolation elements 3). The flexible element 4 may be or include any rope, cord, string, wire or the like.

By bringing together the vibration isolation elements 3, the footprint of the mobile vibration isolation device 5 (i.e., in its compact form) may preferably be reduced to less than about ½ the footprint area of the device 5 when fully spread apart (i.e., with the vibration isolation elements 3 maximally spaced apart and the flexible element 4 is pulled taut), and may further be less than about ¼ or even ⅛ of the of the footprint area of the device 5 when fully spread apart. As will be readily understood by those skilled in the relevant field, depending on the size of the vibration isolation elements 3, even further reduction in the overall footprint of the device 5 may be possible. Further form factor descriptions of the mobile vibration isolation device 5 may be useful and such a description may be determined by the artisan without limitation from the description embodied herein.

Referring now to FIG. 2, a mobile vibration isolation device 25 having two vibration isolation elements 23 connected by a flexible element 24 is shown. The vibration isolation elements 23 may be shaped in any way that maximizes the stability of the electrical or electronic device in FIG. 1, and may be composed of one or more materials which effectively reduces the transfer of the vibration from the vibrating surface. The flexible element 24 may be formed from any flexible medium which allows the vibration isolating elements 23 to be stored in a compact manner, for example, with a form factor that may preferably be less than about ½ the footprint area of the extended vibration isolation array. Further, the form factor may be more preferably less than about ¼ of the footprint area of the extended isolation array, and may further be less than ⅛ of the footprint area of the extended vibration isolation array. The flexible element 24 may comprise a flexible medium and clips or automatic retractors used for connecting multiple flexible segments.

Referring now to FIG. 3, a mobile vibration isolation device 35 having three vibration isolation elements 33 connected by a flexible element 34 is shown. The flexible element 34 may be configured as a contiguous element as shown or as separate elements connecting each of the three vibration isolation elements 33.

Referring now to FIG. 4, a mobile vibration isolation device 45 having four vibration isolation elements 43 connected by a flexible element 44 is shown. The flexible element 44 may be configured as a contiguous element as shown or as separate elements connecting each of the four vibration isolation elements 43.

Figure 5:
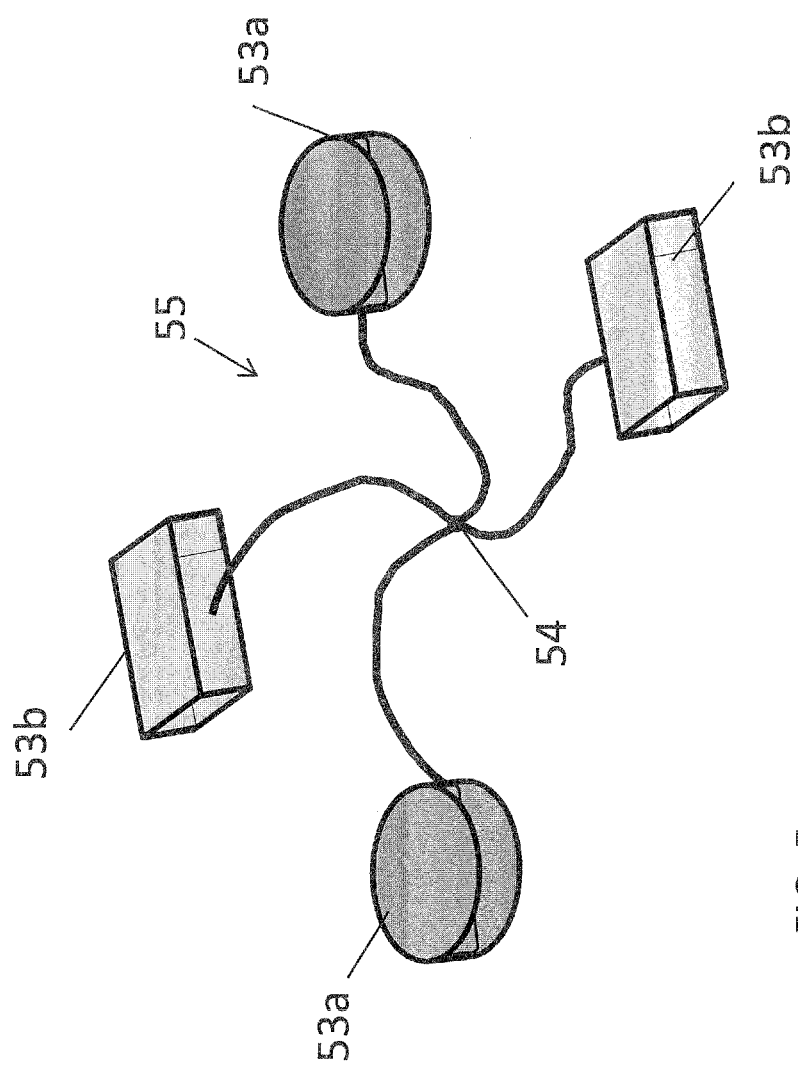
FIG. 5 is a diagram of four vibration isolation elements connected by a flexible element, where two of the elements have a particular mechanical support or isolation characteristic and the other two have a different mechanical support or isolation characteristic, in accordance with embodiments provided by the present disclosure.

Referring now to FIG. 5, a mobile vibration isolation device 55 having four vibration isolation elements 53a, 53b connected by a flexible element 54 is shown. In the embodiment shown in FIG. 5, the mobile vibration isolation device 55 includes one or more vibration isolation elements (e.g., vibration isolation elements 53a) having different mechanical support or vibration isolation characteristics than at least one other vibration isolation elements (e.g., vibration isolation elements 53b). Further, the vibration isolation elements 53a, 53b may have differing shapes and/or sizes. Multiple vibration isolation element types may be used to optimize mechanical support and reduce resonant peaks which may be characteristic of a particular vibration isolation element.

Figure 6:
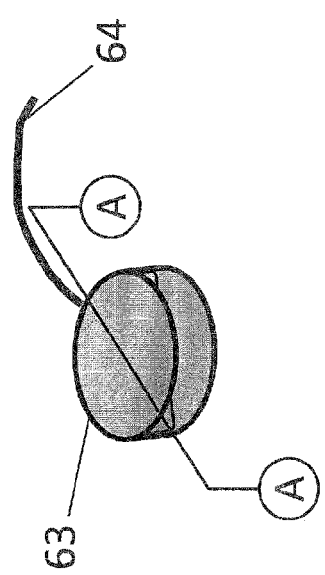
FIG. 6 is a diagram for a typical cross section, Section A-A, through a vibration isolation element with the associated flexible connecting element.

Referring now to FIG. 6, a single vibration isolation element 63 of a mobile vibration isolation device having multiple vibration isolation elements connected by a flexible element 64 is shown. A cross section, Section A-A, through the diameter of the vibration isolation element 63 provides a view for describing possible constructions of the vibration isolation element.

Figure 7:
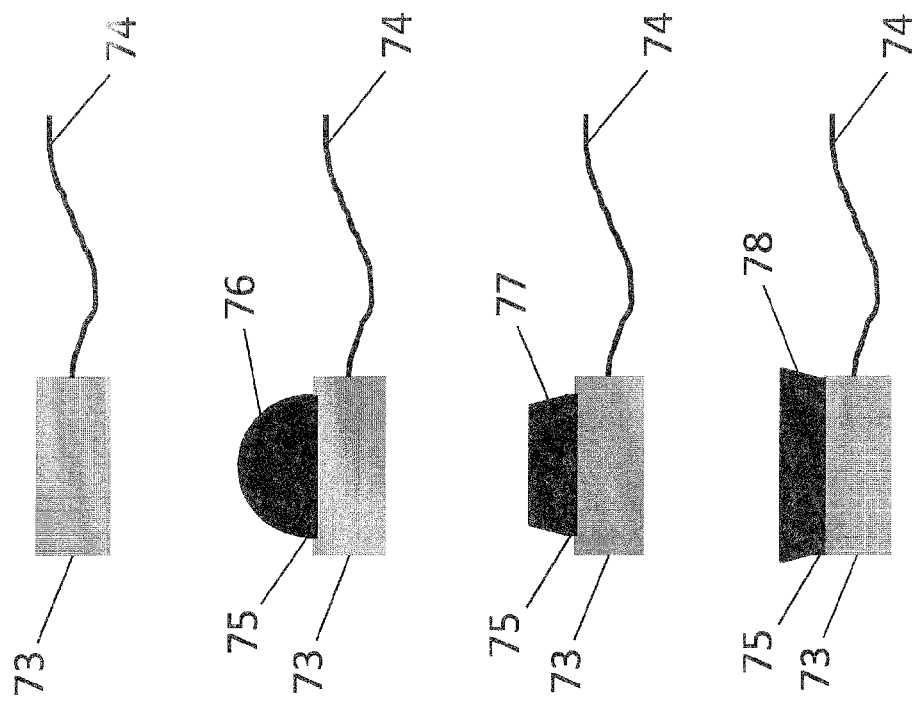
FIG. 7 is a set of cross sectional diagrams, Section A-A, of four exemplary vibration isolation elements with the associated flexible connecting elements; wherein each vibration isolation element is configured with support and vibration absorption components for a particular mechanical support or isolation characteristic, in accordance with embodiments provided by the present disclosure.

Referring now to FIG. 7, cross sectional diagrams, Section A-A, of four exemplary vibration isolation elements with the associated flexible connecting elements are shown; wherein each vibration isolation element is configured with support and vibration absorption components for a particular mechanical support or isolation characteristic. For these examples, a cross linked polyethylene foam pad 73 forms the basis pad of the vibration isolation element. Cross linked polyethylene foams are effective at reducing vibrations, and may provide sufficient vibration isolation for some applications. Such construction is a preferred embodiment for cost restricted applications. Certain visco-elastic rubbers and polymers have the capability to convert vibration energy to heat, thereby providing improved vibration absorption, and can be manufactured in hemispherical and disc shapes. Such visco-elastic rubbers and polymers are hereinafter referred to as vibration absorbing rubber. A hemisphere of a vibration absorbing rubber 76 may be attached to the cross linked polyethylene foam basis pad 73 by an adhesive 75 and connected to other vibration isolating elements in the mobile vibration isolation device by the flexible element 74, thus increasing the vibration isolation capability above that of the basis pad. Discs of the vibration absorbing rubber have a trapezoidal cross section, and may be attached to the cross linked polyethylene basis pad by either the large base or the small base, depending on the support requirements. A disc of a vibration absorbing rubber 77, may be attached by the large base to the cross linked polyethylene foam basis pad 73 by an adhesive 75 and connected to other vibration isolating elements in the mobile vibration isolation device by the flexible element 74, thus increasing the vibration isolation capability above that of the basis pad. A disc of a vibration absorbing rubber 78, may be attached by the small base to the cross linked polyethylene foam basis pad 73 by an adhesive 75 and connected to other vibration isolating elements in the mobile vibration isolation device by the flexible element 74, thus increasing the vibration isolation capability above that of the basis pad. In a preferred embodiment, the preferred vibration absorbing rubber is SORBOTHANE® which is available from Sorbothone, Incorporated, of Kent, Ohio. The manufacture described this product as a thermoset, polyether based, polyurethane material. The use of SORBOTHANE® or any substance with similar vibration absorbing properties improves the vibration isolation performance of the mobile vibration isolation device.

While embodiments are described herein as providing vibration isolation between a vibrating surface such as a speaker cabinet and an electrical or electronic device, it should be readily understood that the mobile vibration isolation devices and methods provided herein may be placed between a vibrating surface and any object for which vibration isolation may be desirable. Moreover, the vibration isolation elements in any embodiment provided herein may provide passive and/or active vibration isolation. Passive isolation may be provided by using, for example, foam, rubber or other such materials having vibration isolating characteristics. Active isolation may be provided by vibration isolation elements utilizing any known active isolation technology (e.g., providing feedback from a vibration sensor to a controller, actuator or the like for controlling the vibration isolation response of the vibration isolation elements).

The following examples are set forth to illustrate the present invention and should not be construed to limit its scope. In the examples, all parts and percentages are by weight unless otherwise indicated.

EXAMPLE 1

The introduction of small or micro bass guitar amplifiers weighing less than 6 pounds has created a need for a compact stabilization and vibration isolation device. Current amplifiers available for use can weigh between 3 and 6 pounds. When used on a speaker cabinet, the light weight of the amplifier leads to situations where the amplifier can fall off of the cabinet due to vibrations transferred from the speaker cabinet. Also, the light weight of the amplifier can lead to the amplifier being pulled off of the cabinet when the player inadvertently moves past the length of the instrument cable away from the amplifier.

The solution to this problem must be compact enough to fit, along with associated cables, into the relatively small carrying case pocket supplied with the amplifier. These pockets are generally not as large as the amplifier itself and may be as small as approximately 4"×8".

Four sponge rubber golf balls (cat toys) and two 36" shoe laces were obtained. The laces were inserted through the middle of the of the golf balls and knotted at their ends to prevent the sponge balls from slipping off the end of the laces, and such that the length between the two balls at the end of each lace was about 10". The two laces were knotted at their center using a square knot, such that, when laid on top of the speaker cabinet, the laces formed an "X" with the sponge balls at each of the four ends.

A Genz Benz Shuttle 9.0 bass guitar amplifier was placed on top of the sponge balls on top of a Bergantino AE212 bass guitar speaker cabinet and used for playing the bass guitar through the cabinet. Vibrations from the speaker cabinet to the amplifier were noticeably reduced.

EXAMPLE 2

A foam gardening kneeling pad 0.75" thick was obtained. Four 1.5"×1.5" pads were cut from the foam gardening kneeling pad, and connected by the "X" shaped shoe lace connecting element, as described in the previous example. The mobile vibration isolation device thus formed was placed between the bass guitar amplifier and the speaker cabinet, as described in Example 1. The flat vibration isolation elements improved the stability of the amplifier on top of the speaker cabinet while providing vibration isolation for the device. Vibrations from the speaker cabinet to the amplifier were reduced.

EXAMPLE 3

Four 1.5" diameter discs were cut by high pressure water jet from a sheet of 0.75" thick cross linked polyethylene foam, and connected by an "X" shaped parachute cord connecting element, as described in Example 1. The mobile vibration isolation device thus formed was placed between the bass guitar amplifier and the speaker cabinet, as described in Example 1. The smaller, or more mobile, vibration isolation elements provided vibration isolation for the device. Vibrations from the speaker cabinet to the amplifier were reduced.

EXAMPLE 4

Four 1.0" diameter SORBOTHANE® hemispheres, 50 duro, were attached to the four cross linked polyethylene foam pads of the mobile vibration isolation device described in Example 3. The SORBOTHANE® hemispheres were adhered to the cross linked polyethylene foam pads using a 3M pressure sensitive adhesive. The mobile vibration isolation device thus formed was placed between the bass guitar amplifier and the speaker cabinet, as described in Example 1. The vibration isolation elements with SORBOTHANE® hemispheres improved the stability of the amplifier on top of the speaker cabinet while providing vibration isolation for the device. Vibrations from the speaker cabinet to the amplifier were reduced compared to the mobile vibration isolation device described in Example 3.

The foregoing description and embodiments are intended to illustrate the invention without limiting it thereby. It will be obvious to those skilled in the art that the invention described herein can be essentially duplicated by making minor changes in the material content, the method of manufacture, or geometric architecture. To the extent that such material, methods, or designs are substantially equivalent, it is intended that they be encompassed by the following claims.

What is claimed is:

1. A portable vibration isolation device for supporting an object on a surface, comprising:
    an array of two or more vibration isolation elements each comprised of a foam or rubber material and having at least two different resonance characteristics; and
    one or more solid core flexible elements connecting said array of vibration isolation elements, wherein the solid core flexible elements are formed of a material different from the material forming the vibration elements, and
    wherein said vibration isolation device is mobile, and is adapted to be deployed in a substantially coplanar arrangement on said surface, between said surface and the object, in use, and stored in a compact form without disassembly.

2. The device of claim 1, wherein one or more of the vibration isolation elements comprise a vibration damping foam.

3. The device of claim 1, wherein one or more of the vibration isolation elements comprise a visco-elastic rubber or polymer capable of converting vibration energy to heat.

4. The device of claim 3, wherein the visco-elastic rubber or polymer capable of converting vibration energy to heat comprises a thermoset, polyether-based polyurethane.

5. The device of claim 1, wherein said one or more flexible elements comprises at least one of: a linear string, rope, cord, polymer line, elastomer, ribbon, or wire.

6. The device of claim 1, wherein at least one of the vibration isolation elements provides active isolation using vibration sensors and feedback mechanisms.

7. The device of claim 1, wherein the flexible elements allow the vibration isolation elements to be bundled together into a compact form for storage of the mobile vibration isolation device.

8. A method for reducing vibration transfer from a surface to electrical or electronic devices on said surface, comprising:
    providing a vibration isolation device, comprising:
        an array of two or more vibration isolation elements each comprised of a foam or rubber material; and
        one or more solid core flexible elements connecting said array of vibration isolation elements,
        wherein said vibration isolation device is mobile and is adapted to be stored in a compact form without disassembly;
    moving said vibration device from storage, and
    deploying said vibration isolating elements in a substantially coplanar arrangement on said surface between said surface and the electrical or electronic devices, whereby to isolate said electrical or electronic device and the vibrating surface, thereby reducing vibration transfer to the electrical or electronic device.

9. The method of claim 8, wherein the electrical or electronic device comprises a musical instrument amplifier or sound reproduction component.

10. A portable vibration isolation device for supporting an object on a surface, comprising:
    an array of two or more vibration isolation elements each comprised of a foam or rubber material, wherein the vibration isolation elements comprise at least two different resonance characteristics; and
    one or more solid core flexible elements connecting said array of vibration isolation elements,
    wherein said vibration isolation device is mobile, and is adapted to be deployed in a substantially coplanar arrangement on said surface, in use, and stored in a compact form without disassembly.

11. The device of claim 10, wherein one or more of the vibration isolation elements comprise a vibration damping foam.

12. The device of claim 10, wherein one or more of the vibration isolation elements comprise a visco-elastic rubber or polymer capable of converting vibration energy to heat.

13. The device of claim 12, wherein the visco-elastic rubber or polymer capable of converting vibration energy to heat comprises a thermoset, polyether-based polyurethane.

14. The device of claim 10, wherein said one or more flexible elements comprises at least one of: a linear string, rope, cord, polymer line, elastomer, ribbon, or wire.

15. The device of claim 10, wherein at least one of the vibration isolation elements provides active isolation using vibration sensors and feedback mechanisms.

16. The device of claim 10, wherein the flexible elements allow the vibration isolation elements to be bundled together into a compact form for storage of the mobile vibration isolation device.

* * * * *